(12) United States Patent
Darbinyan et al.

(10) Patent No.: US 8,650,748 B2
(45) Date of Patent: Feb. 18, 2014

(54) UNIVERSAL CHIP CARRIER AND METHOD

(75) Inventors: Artur Darbinyan, Santa Clara, CA (US); David T. Chin, Cupertino, CA (US); Kurt E. Sincerbox, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 208 days.

(21) Appl. No.: 13/106,383

(22) Filed: May 12, 2011

(65) Prior Publication Data

US 2012/0285730 A1    Nov. 15, 2012

(51) Int. Cl.
*H05K 3/30*    (2006.01)

(52) U.S. Cl.
USPC ............ 29/841; 29/412; 29/417; 29/832; 29/739; 257/674; 257/687; 257/778; 438/112; 174/251; 174/520

(58) Field of Classification Search
USPC ........... 29/841, 832, 834, 835, 840, 739, 745, 29/412, 415, 417; 257/674, 687–690, 778, 257/779, 787, 666, 676; 438/112, 121, 110, 438/113, 124–127; 174/251, 520, 521
See application file for complete search history.

(56) References Cited

U.S. PATENT DOCUMENTS

| | | | |
|---|---|---|---|
| 6,294,731 B1* | 9/2001 | Lu et al. ................. | 174/388 |
| 6,689,640 B1 | 2/2004 | Mostafazadeh | |
| 6,740,961 B1 | 5/2004 | Mostafazadeh | |
| 6,838,768 B2* | 1/2005 | Corisis et al. .......... | 257/738 |
| 7,846,775 B1 | 12/2010 | Lee et al. | |
| 2007/0222065 A1* | 9/2007 | Andry et al. .......... | 257/723 |

* cited by examiner

*Primary Examiner* — Peter DungBa Vo
*Assistant Examiner* — Jeffrey T Carley
(74) *Attorney, Agent, or Firm* — Eugene C. Conser; Wade J. Brady, III; Frederick J. Telecky, Jr.

(57) ABSTRACT

A method of fabricating chip carriers suitable for use in packaging integrated circuits and other electronic, electromechanical and opto-electronic devices is described. In general, a number of wires (or wires and rods) are arranged in parallel in a wiring fixture. After the wires are positioned, they are encapsulated to form an encapsulated wiring block. The wiring block is then sliced to form a number of discrete panels. Preferably, the various wires are geometrically positioned such that each resulting panel has a large number of device areas defined therein. The encapsulant in each panel effectively forms a substrate and the wire segments in each panel form conductive vias that extend through the substrate. The resulting panels/chip carriers can then be used in a wide variety of packaging applications.

11 Claims, 8 Drawing Sheets

UNIVERSAL CHIP CARRIER AND METHOD

BACKGROUND OF THE INVENTION

The present invention relates generally to the packaging of electronic components. More specifically, the invention relates to chip carriers and methods of forming such carriers.

There are a wide variety of integrated circuit packaging techniques that are commonly used in the semiconductor industry. One common packaging approach contemplates mounting one or more integrated circuits on a structure referred to as a chip carrier having interconnect routing thereon that facilitates electrically connecting the integrated circuit to external devices. One common type of chip carrier is a BGA substrate, which typically takes the form of a dielectric substrate having metal wiring printed on opposing surfaces and conductive vias that extend through the substrate to electrically connect the printed wiring layers. Other common types of chip carrier include silicon interposers, lead frames and flexible carriers.

Although existing chip carriers work well in a wide variety of applications, a drawback of most chip carriers is that they can be relatively expensive to produce. Therefore, there on ongoing efforts to provide even more cost effective chip carriers that can be used in semiconductor packaging applications.

SUMMARY OF THE INVENTION

To achieve the foregoing and other objects of the invention, a number of wires (or wires and rods) are arranged in parallel in a wiring fixture. The wires are geometrically positioned in an arrangement that corresponds to the desired contact layout for the desired chip carriers. After the wires are positioned, they are encapsulated to form an encapsulated wiring block. The wiring block is then sliced to form a number of discrete panels. Each panel has one or more device areas that are suitable for use as independent chip carriers. The encapsulant in each panel effectively forms a substrate and the wire segments in each panel form conductive vias that extend through the substrate. The panels/chip carriers are suitable for use in a wide variety of packaging applications.

In some preferred embodiments, the wire support fixture is arranged to keep the wires in tension during the encapsulation and the wiring fixture is arranged to hold the wires such that the wires extend substantially vertically during the encapsulation. This helps maintain the relative positioning of the wires from panel to panel.

The chip carrier panels may take a wide variety of forms. In some embodiments, the panels have one or more two dimensional arrays of device areas defined thereon, with each device area being suitable for use as a chip carrier for a separate integrated circuit package after singulation of the panel. The chip carrier panels may be arranged in a form factor that is suitable for use by conventional semiconductor packaging equipment (e.g. in the form factor of conventional semiconductor wafers, lead frame strips, substrate panels, etc.).

The resulting chip carrier panels are suitable for use in a wide variety of traditional semiconductor packaging applications. For example, a number of dice may be mounted on a first (e.g., top) surface of the panel, such that each die is mounted on an associated device area, with each die being electrically connected to a plurality of the conductive vias in an associated device area. Each device area typically has one or more chip placement areas. An encapsulant material may then be formed over the first surface of the chip carrier panel to encase the dice (e.g. by molding). Thereafter, the panels may be singulated to form a multiplicity of packaged integrated circuit devices, with each singulated device corresponding to an associated device area in the chip carrier panels. When desired, solder bumps (or other I/O structures) may be formed on the conductive vias over the back surface of the panel to provide electrical interconnects suitable for connection to external devices in the singulated devices. In some embodiments, conductive traces that are electrically connected to the conductive vias may be provided on one or both of the surfaces of the carrier to facilitate redistribution of the contacts.

BRIEF DESCRIPTION OF THE DRAWINGS

The invention and the advantages thereof, may best be understood by reference to the following description taken in conjunction with the accompanying drawings in which.

In the drawings, like reference numerals are sometimes used to designate like structural elements. It should also be appreciated that the depictions in the figures are diagrammatic and not to scale.

DETAILED DESCRIPTION OF THE PREFERRED EMBODIMENTS

The present invention relates generally to the formation of carriers suitable for use in packaging integrated circuits and other electronic, electro-mechanical and opto-electronic devices. In general, the present invention contemplates arranging a number of wires (or wires and rods) in parallel. The various wires are geometrically positioned in an arrangement that corresponds to the desired contact layout for the desired chip carriers. After the wires are positioned, they are encapsulated to form an encapsulated wiring block. The wiring block is then sliced to form a number of discrete panels. Each panel has one or more device areas that are suitable for use as chip carriers. The encapsulant in each panel effectively forms a substrate and the wire segments in each panel form conductive vias that extend through the substrate. The panels/chip carriers can then be used in a wide variety of packaging applications. As will be apparent from the description below, the described approach facilitates the production of very cost effective chip carriers that may be used in many different packaging applications.

Figure 1A:
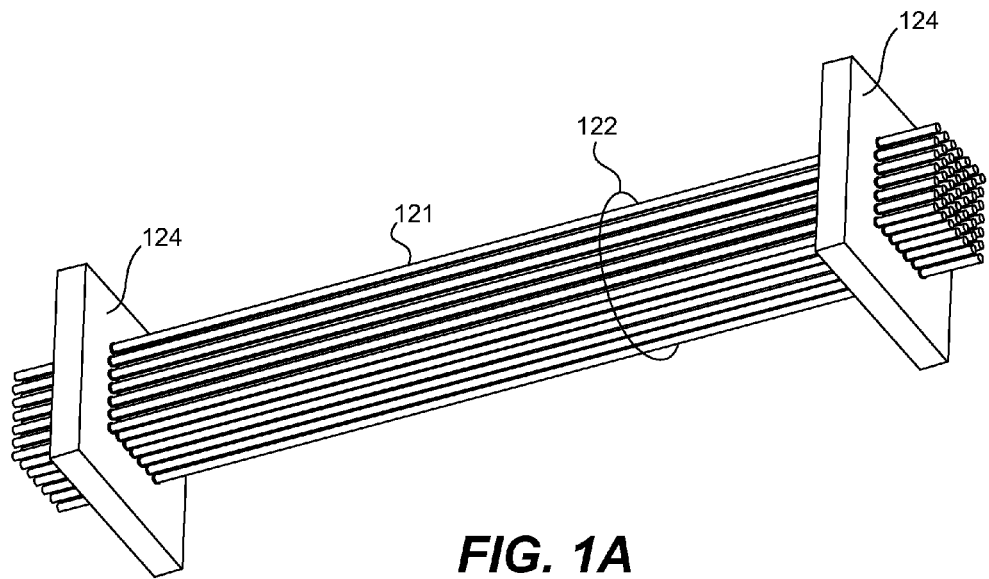
FIG. 1(a) is a diagrammatic perspective view of a wiring array suitable for use in forming chip carriers in accordance with one embodiment of the present invention.

The carrier formation process will be conceptually explained with reference to FIGS. 1-3. Generally, a number of wires 121 are arranged in a wiring fixture to extend substantially in parallel. In the embodiment illustrated in FIG. 1(a), the wiring fixture includes a matched pair of alignment plates 124. Each of the alignment plates 124 has a series of wire receiving holes 125 formed therein that are each sized to receive an associated wire 121 as illustrated in FIG. 2(a). The holes 125 in the alignment plates are generally positioned to correspond to the position of contacts on the desired chip carriers. The wires 121 are arranged to extend in parallel and therefore, like the holes in the alignment plates, the wires 121 are generally positioned to correspond to the positions of the contacts in the desired chip carriers. Once the wires 121 of wiring bundle 122 are in place, they are encapsulated using an appropriate encapsulant material. A variety of different materials may be used as the encapsulant. By way of example, thermosetting plastic materials commonly used in semiconductor packaging applications work well as the encapsulant.

Figure 1B:
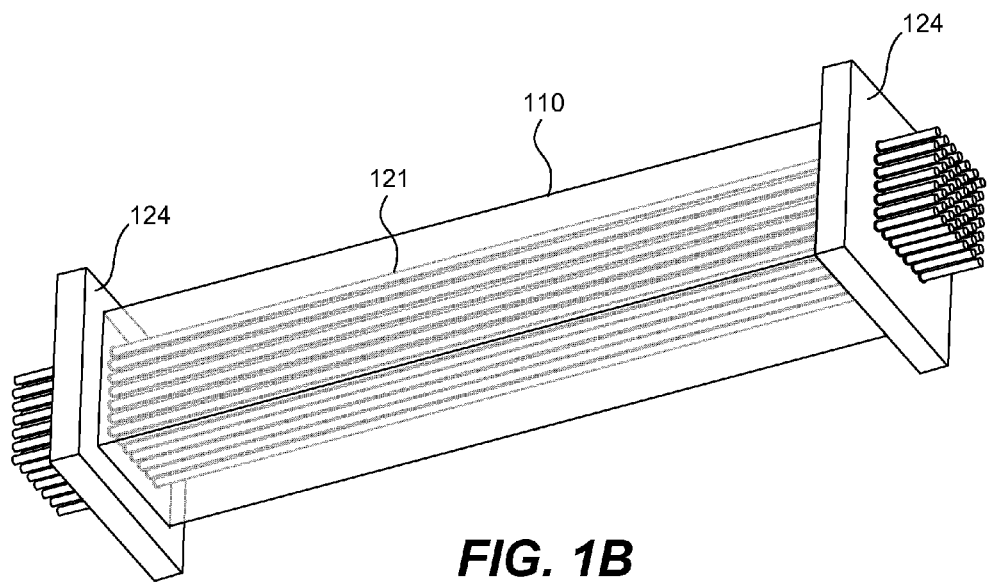
FIG. 1(b) is a diagrammatic perspective view of an encapsulated wire block that is formed after encapsulation of the wiring array of FIG. 1(a) in accordance with one embodiment of the present invention.
Figure 2A:
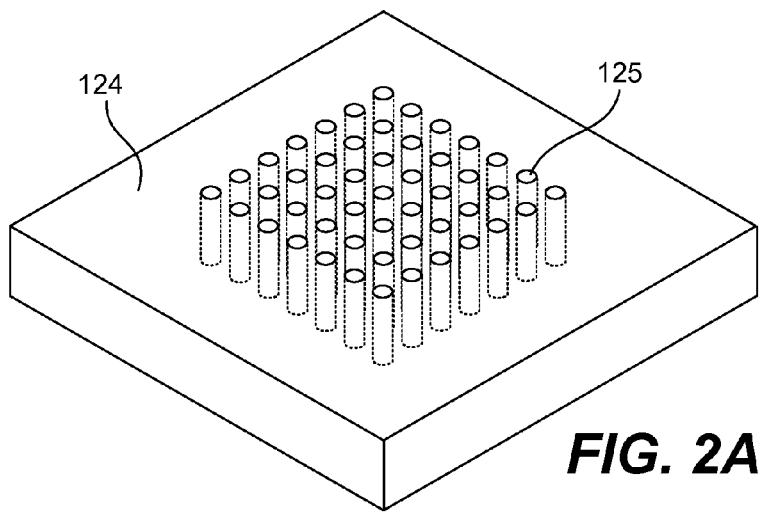
FIGS. 2(a)-2(c) illustrate three different alignment plate geometries that are suitable for use in supporting the wires during the formation of the wire block illustrated in FIG. 1(b).
Figure 2B:
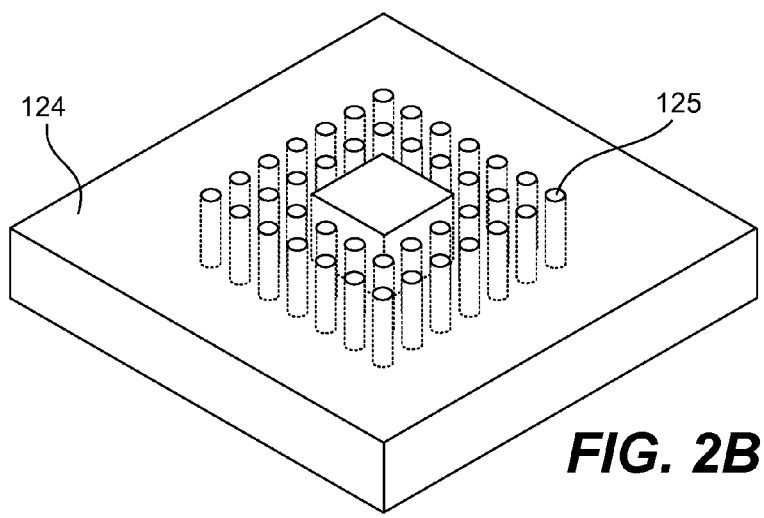
Figure 2C:
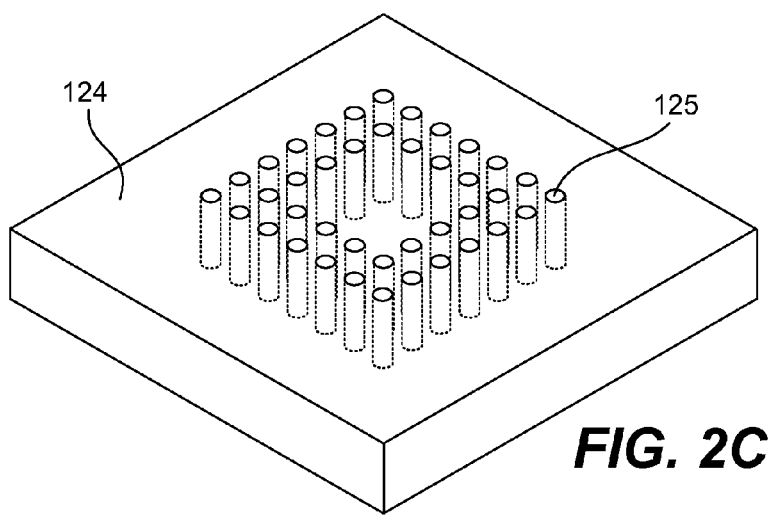
Figure 3A:
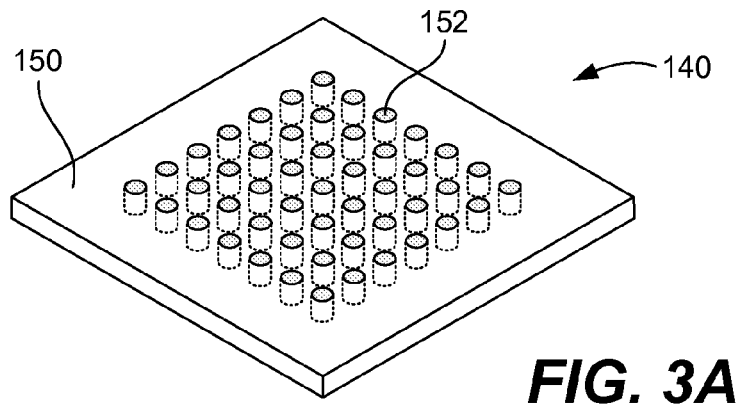
FIGS. 3(a)-3(c) are diagrammatic illustrations of chip carrier formed by slicing the wiring block having the alignment plates of FIGS. 2(a)-2(c) respectively.
Figure 3B:
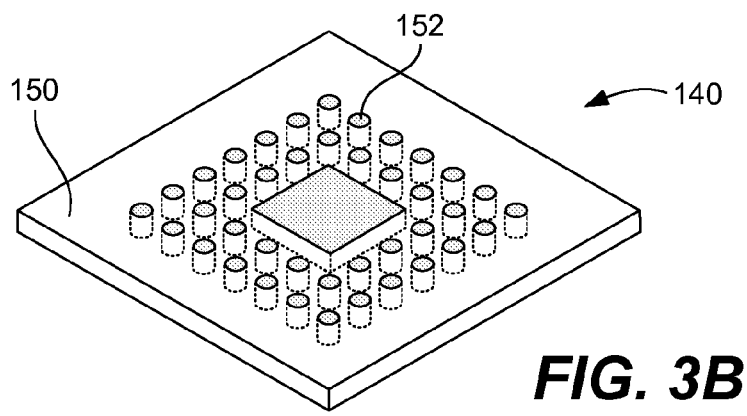
Figure 3C:
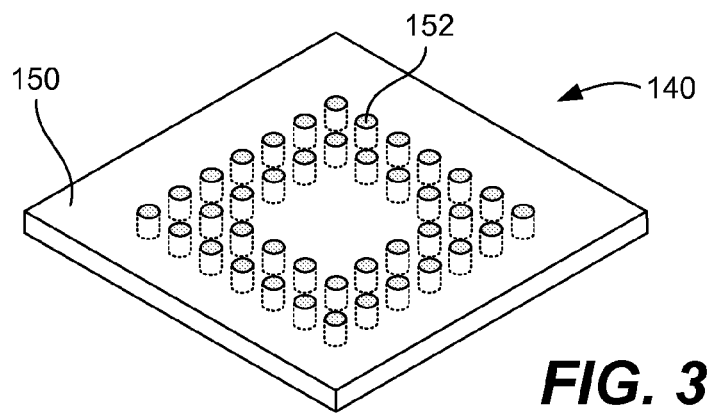

The encapsulation creates an encapsulated wire block 110 having wires arranged in the desired contact pattern as best illustrated in FIG. 1(b). The wire block 110 is then sliced to form a number of discrete panels 140. The panels 140 that are sliced from the wire block have wire segments 152 that are arranged in the pattern that is desired for the chip carrier 150 as seen in FIGS. 3(a)-3(c) which correspond respectively to the chip carriers that are formed from wiring blocks formed using the alignment plates of FIGS. 2(a)-2(c) respectively. Thus, the wire segments 152 effectively define the contact pattern for the carrier. When the encapsulation block is sliced, the panels are cut to a thickness that is appropriate for the carrier. Thus, the resulting panels 140 are suitable for direct use as chip carriers 150—although as will be explained in more detail below, it may be desirable to trim or otherwise process the carriers before they are used in actual packaging applications.

The length of the wiring bundles may be widely varied. For example wiring bundles having lengths on the order of 10 cm to 1 meter are believed to be suitable for many applications although both longer and shorter wiring bundles are possible. In some applications it will be desirable to have wiring bundles that extend for several meters. As will be described in more detail below, when relatively longer wiring bundles are used, it may be desirable to use a number of intermediate alignment plates.

In the diagrammatic illustrations of FIGS. 1-3, the alignment plates, their hole patterns, the wiring and thus the resulting panels are sized to correspond generally to the requirements of a single carrier 150. With such an arrangement, a single wiring block could result in the creation of 10's, 100's or 1000's of chip carriers depending on the length of the wiring block. Although these economies of scale are theoretically useful, it should be appreciated that they can be multiplied many fold by forming panels 140 having multiple device areas thereon. By way of example, an alignment plate hole pattern/panel geometry that defines a 5×5 array of device areas would create 25 chip carriers in each panel, a 10×10 array of device areas would create 100 chip carriers in each panel, etc. It should be apparent that the economies of scale can be greatly enhanced by forming larger panels of carriers using the described process. Thus, in most practical applications, it is expected that each panel will have a multiplicity of device areas formed thereon.

Figure 4:
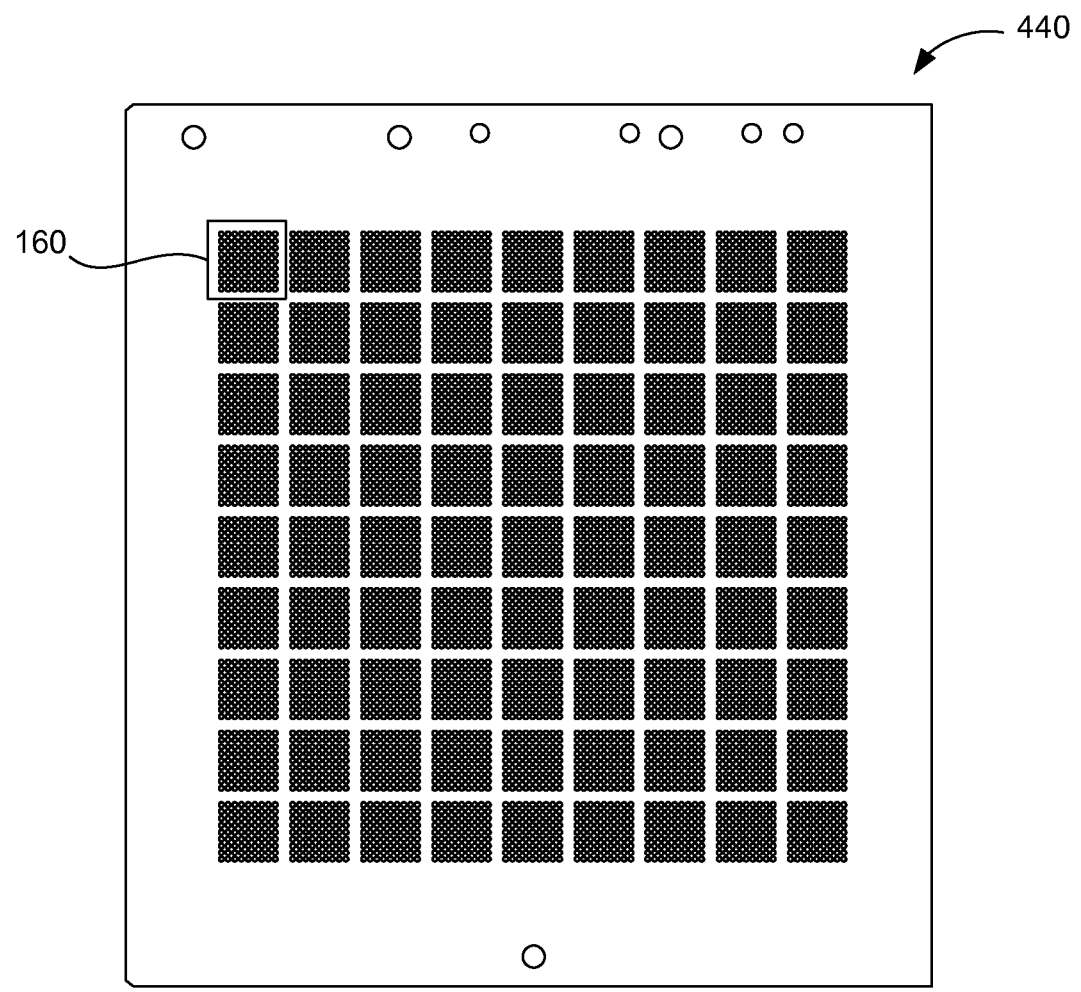
FIG. 4 is a diagrammatic illustration of a chip carrier panel having a two dimensional array of device areas formed thereon.

For example, FIG. 4 illustrates an alignment plate/carrier panel layout that has a two dimensional array of device areas 160 defined therein (i.e., a 9×9 array in the illustrated embodiment). When alignment plates of this nature are used, the resulting panels 440 will define a multiplicity of device areas, as for example eighty one devices areas in the illustrated embodiment.

Figure 5:
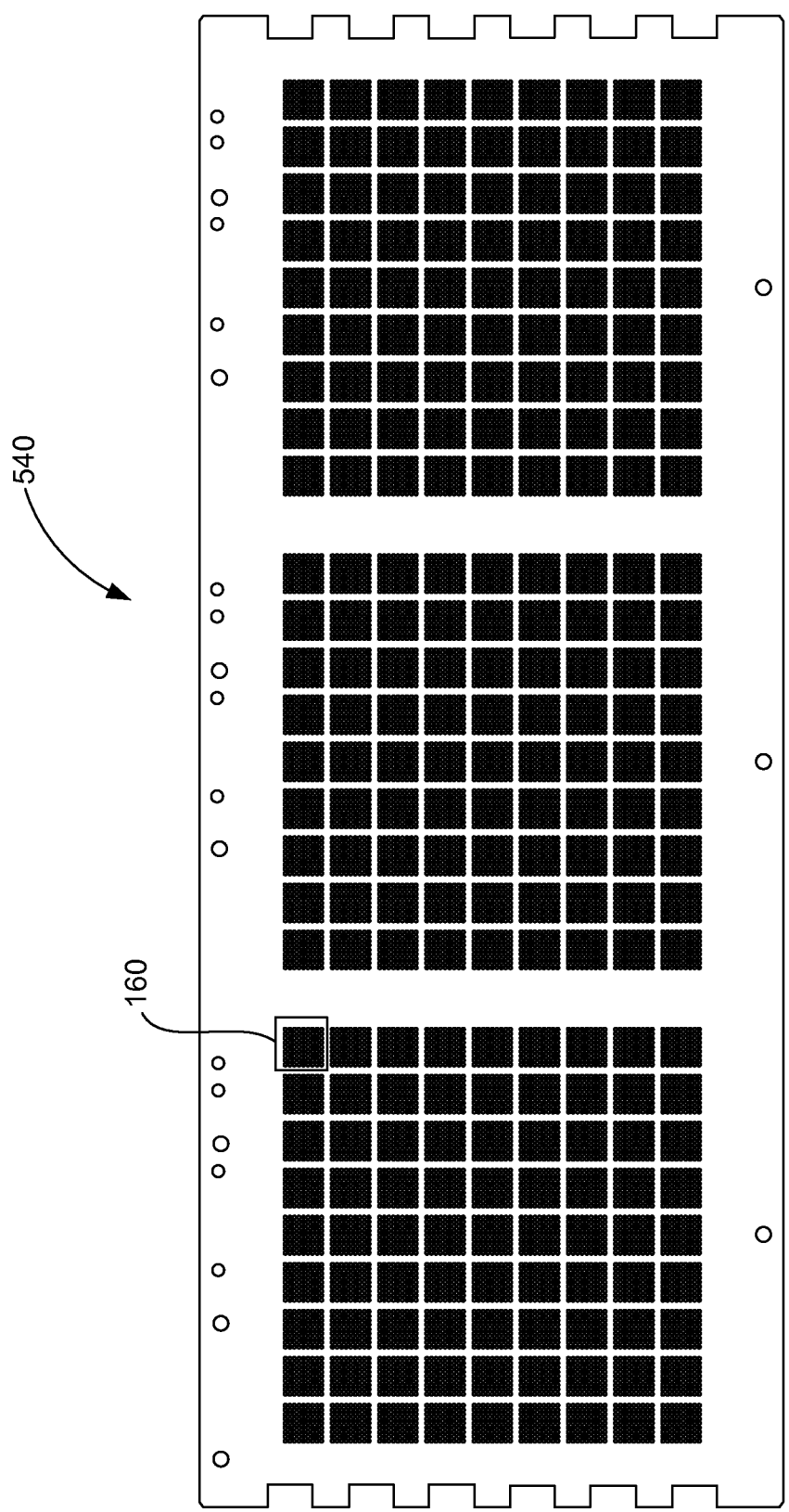
FIG. 5 is a diagrammatic illustration of a chip carrier panel having the form factor of a lead frame strip with a plurality of spaced apart two dimensional arrays of device areas formed thereon.
Figure 6:
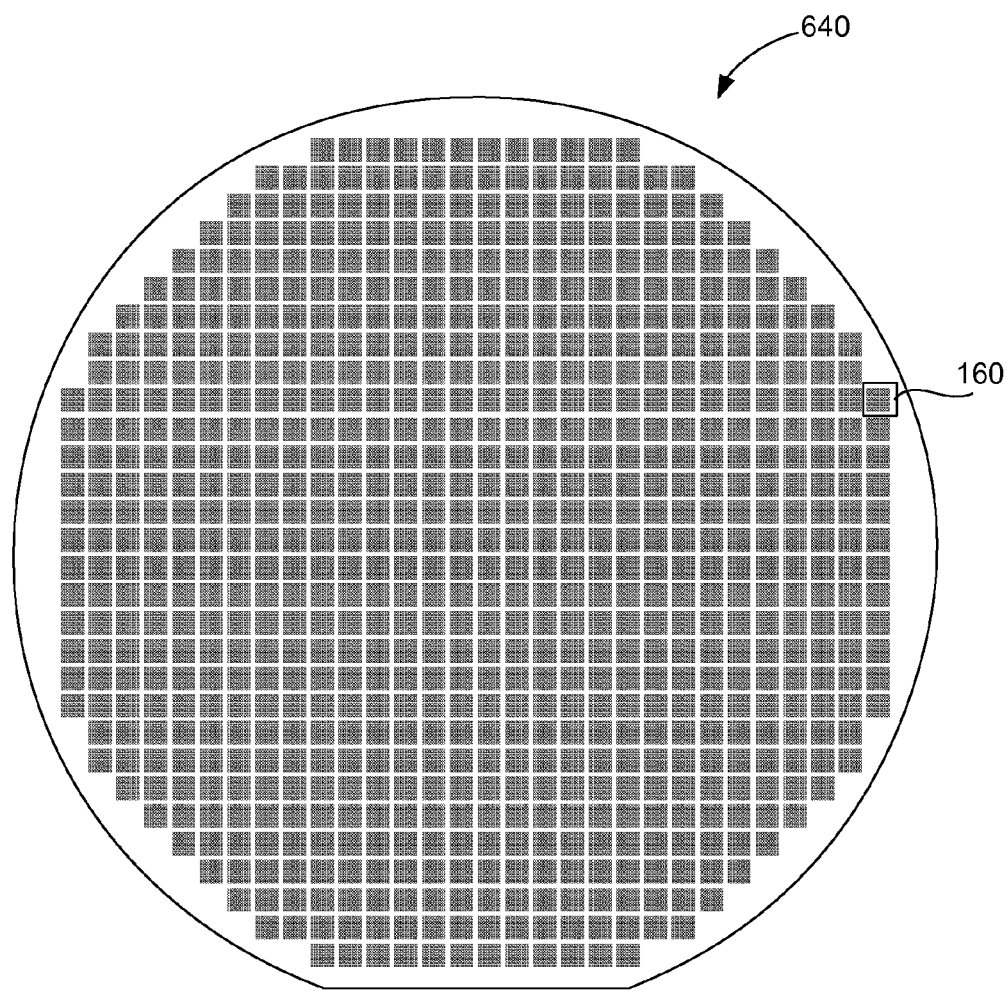
FIG. 6 is a diagrammatic illustration of a chip carrier panel having the form factor of a wafer.
Figure 7A:
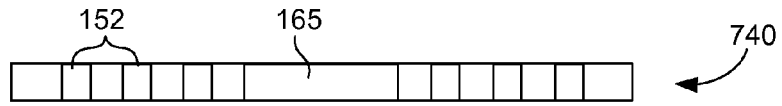
FIGS. 7(a)-7(e) are diagrammatic illustrations showing steps in one suitable process of packaging integrated circuits utilizing chip carriers formed in accordance with the present invention.
Figure 7B:
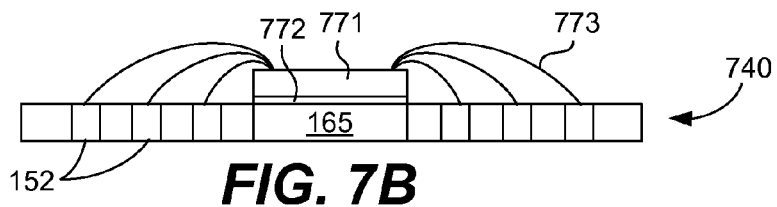
Figure 7C:
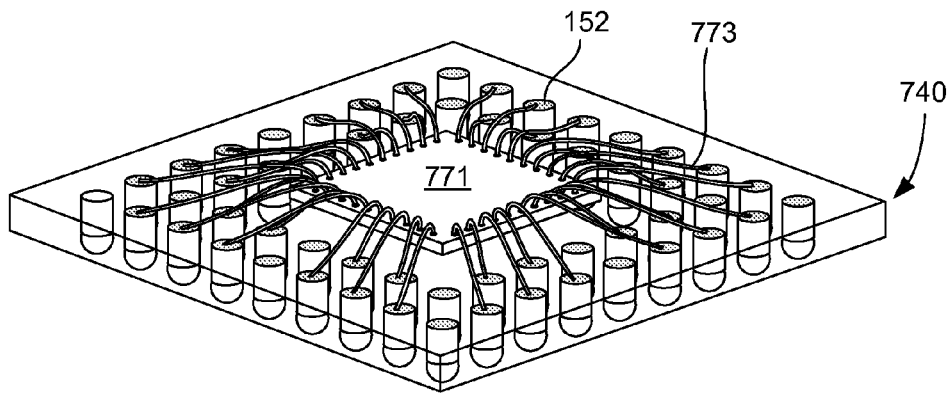
Figure 7D:
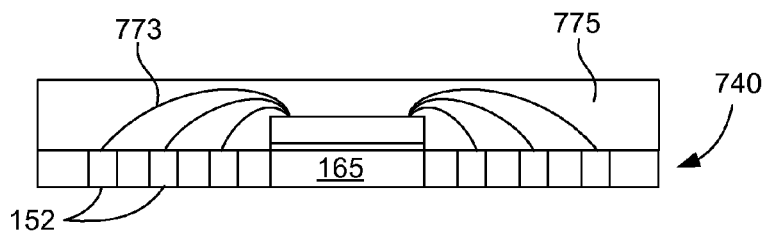
Figure 7E:
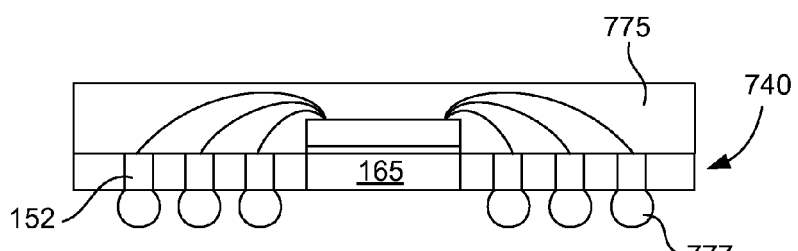

In practice, the semiconductor packaging industry has a large base of packaging equipment (e.g., die attach machines, wire bonding machines, molding equipment, solder bumping equipment, dicing and singulation equipment, etc.) that is designed to handle specific form factors such as lead frame (or other substrate) strips, wafers, etc. To leverage those capabilities, in many applications it may be desirable to arrange the panels in form factors that are suitable for handling by existing equipment. For example, the panels 440 may take the form of two-dimensional arrays of device areas (as illustrated in FIG. 4); strips 540 having multiple spaced apart two-dimensional arrays of device areas that resemble conventional lead frame or substrate strips (as illustrated in FIG. 5); or conventional semiconductor wafer geometries 640 (as illustrated in FIG. 6). In such cases, each panel may include many 10's, 100's or even 1000's of device areas which provides both significant economies of scale and compatibility with existing packaging equipment. Such compatibility allows packages that are built using the described carriers to be assembled using standard packaging techniques and equipment. It should be appreciated that when each panel has a large number of device areas formed thereon, many thousands or even hundreds of thousands of carriers can readily be formed from a single wiring block.

The described approach can be used to create carriers having a wide variety of contact patterns. In the embodiment illustrated in FIG. 3(a), each device area has a fully populated array of contacts/wire segments 152. Although such patterns are useful, there are many applications where other contact patterns will be desired. For example, in some applications it may be desirable to include a central die attach area 155 in each carrier that is does not have any contacts therein as illustrated, for example, in FIG. 3(c). Such an arrangement can readily be made by simply not providing any wires in the region of the die attach area. In such embodiments the molding material will occupy the die attach regions and the die attach areas 155 will be solid when the panels are sliced from the wiring block 110.

In other embodiments, it may be desirable to provide a metallic die attach pad 165 as illustrated in FIG. 3(b). Such an arrangement can readily be formed by positioning appropriately sized rods (not shown in FIG. 1) at the desired locations in the wiring block in place of simple wires. The alignment plates 124 can readily be designed to support rods at appropriate locations within the wiring array in addition to and/or in place of wires. When a wiring array is arranged such that each device area has a centrally positioned rod, the carriers formed by the slicing of the wiring block will have centrally located die attach pads 165 therein as seen in FIG. 3(b). In the embodiments of FIGS. 3(b) and 3(c), the die attach pads 165 and the die attach areas 155 are centrally located. However, it should be appreciated that the die attach pads/die attach areas may be positioned at any desired geometric location within their respective device areas. The die attach pads may be desirable to facilitate improved heat transfer from the die to external locations and/or to provide an additional electrical contact for the resultant package (e.g., a ground pad).

It should be apparent that the placement of wires and rods can be widely varied to produce carriers having virtually any arrangement of contacts. Additionally, the size and shapes of the contacts may readily be provided merely by using appropriately dimensioned wires and/or rods. For example, contacts having circular, oval, rectangular, square, rectangles or squares with rounded corners, elongated, curved or other any of a variety of other geometries may readily be formed merely by using appropriately shaped wire/rods in the wiring bundle 122. By way of example, in addition to die attach pads, suitably shaped bus bars (which are often elongated), or other components can readily be formed in the carriers. Similarly, the diameter, width or other desired surface dimension of contacts may readily be adjusted merely by selecting the appropriate dimensioned wires and/or rods. When desired, contacts of different sizes may readily be provided within the same carrier.

In order to form consistent carriers it is desirable to hold the wires in place as close to parallel to one another as is practical during encapsulation. The wires in the wiring bundle 122 are preferably tensioned during the encapsulation to help maintain their relative position during the encapsulation (i.e., help insure that the wires are parallel during the encapsulation) and to reduce the risk and magnitude of any deviations from parallel that may occur. Any of a variety of conventional wire tensioning methods and mechanism (not shown) may be used to tension the wired during the encapsulation. By way of example, spring loaded clamps may be used to applied the desired tension.

It should be appreciated that gravitational effects will tend to cause some sagging in horizontally extending wires. Such gravitational effects can be mitigated by arranging the wires/rods to extend vertically (or substantially vertically) rather than horizontally, particularly during the encapsulation step. Therefore, to minimize gravitationally induced sag in the wires, it is generally preferable to arrange the wiring bundle to extend vertically during the encapsulation (although this is not strictly required). The gravitational effects can also be reduced by shortening the distance between alignment plates—however that involves a tradeoff since it is generally desirable to have longer spans between alignment plates to help achieve economies of scale.

The actual construction of the wiring fixture may be widely varied. The principle requirements are that the fixture be capable of supporting the wires/rods substantially in parallel during the encapsulation. In the diagrammatically illustrated embodiment, a pair of alignment plates are provided to define opposite ends of the wiring block. However, in alternative embodiments, a series of several alignment plates may be provided such that there are intermediate alignment plates in addition to end plates. In some embodiments, the alignment plates may be separate components that are placed together with the wiring bundle into a mold or other cavity to facilitate encapsulation. In such embodiments, the plates may be either disposable or reusable. In other embodiments, the alignment plates may be integrated into the encapsulation cavity or mold.

The encapsulation may also be accomplished in a wide variety of manners. By way of example, molding using a thermosetting plastic material commonly used in semiconductor packaging applications works well. In other applications, a cavity that receives the wiring bundle 122 may simply be filled with the encapsulant material.

After the wire block 110 has been formed, it may, in some embodiments, be desirable to trim the block to the desired cross sectional form factor for the block. This is particularly appropriate in embodiments that do not have good control over the tolerances of the wire block.

In the embodiment illustrate in FIGS. 1(*a*) and 1(*b*), all of the wires in the wiring block are intended for use in the resultant chip carriers. However, in other embodiments additional wires or rods could be used to create fiducials in the chip carrier panels that may be used as panel referenced points by imaging systems that are used in subsequent processing.

The resultant chip carrier panels 140, 400, 540, 640, etc. may be used in a wide variety of packaging applications. In some embodiments, the sliced chip carrier panels may be used directly as the chip support panels used in specific packaging processes. In other embodiments, it may be desirable to provide redistribution traces on one (or even both) sides of the carrier. The redistribution traces can readily be formed using traditional metallization techniques.

One suitable process for packaging integrated circuits using the described chip carriers will be explained with reference to the sequence of FIG. 7. For illustrative purposes, the portion of the panel corresponding to just one device area is shown in FIG. 7. However, it should be appreciated that in most embodiments, larger panels (such as those shown in FIGS. 4-6) would be used with the processing of the different device areas being done substantially in parallel. In the illustrated embodiment, each device area in the panel 740 includes a die attach pad 165 and a plurality of vias 152 formed from wire segments.

Initially, a multiplicity of dice 771 are mounted on the carrier panel 740, with each die 771 being mounted on an associated die attach pad 165. FIG. 7(*a*). The dice may be attached to their respective die attach pads using a die attach adhesive 772 or I/O pads (sometimes referred to as bond pads) on the dice are then electrically connected to associated vias 152 by conventional techniques such as wire bonding using bonding wires 773. FIGS. 7(*b*) and 7(*c*). The dice and bonding wires on the panel are then encapsulated with an encapsulant 775 using conventional encapsulation techniques such as molding. FIG. 7(*d*). After encapsulation, solder bumps 777 are attached to the conductive vias 152 exposed on the bottom surface of the panel. The bumped panels may then be singulated using conventional panel singulation techniques such as sawing or laser cutting. It should be appreciated that the singulation cutting will typically be done through plastic molding material—as opposed to harder materials such as a metallic lead frame or even a semiconductor wafer substrate, which help speed and reduce costs associated with the singulation process. The resulting singulated packages may have an appearance similar to that shown in FIG. 7(*e*).

Another representative packaging process using the carrier panels with the dice flip chip mounted on the panels is illustrated in the sequence of FIG. 8. In this illustrated embodiment, a carrier panel 840 having device areas 160 that each include a central, non-conductive die attach area 155 is used as best seen in FIG. 8(*a*). A patterned redistribution layer (sometimes referred to as a routing layer) is then formed on the top surface of the carrier panel 840 using standard metallization techniques. In the illustrated embodiments, the redistribution layer includes conductive contact landings 881 and conductive traces 882. The contact landings are formed over the die attach areas and traces 882 are each arranged to electrically connect an associated contact landing 881 to an associated via 152 as best seen in FIGS. 8(*b*) and 8(*d*). The traces 882 would typically be arranged to extend over non-conductive portions of the chip carrier until they reach their associated via.

Figure 8A:
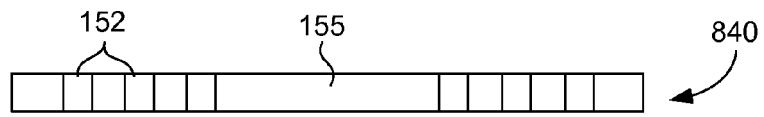
FIGS. 8(a)-8(f) are diagrammatic illustrations showing steps in one suitable process of flip chip style packaging of integrated circuits utilizing chip carriers formed in accordance with the present invention.
Figure 8B:
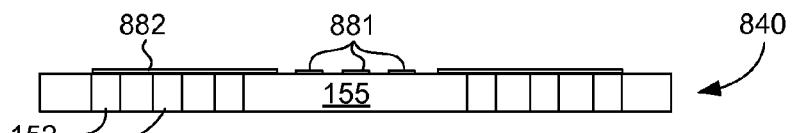
Figure 8C:
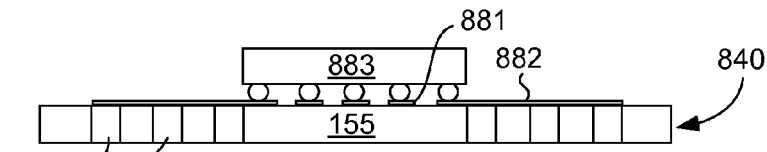
Figure 8D:
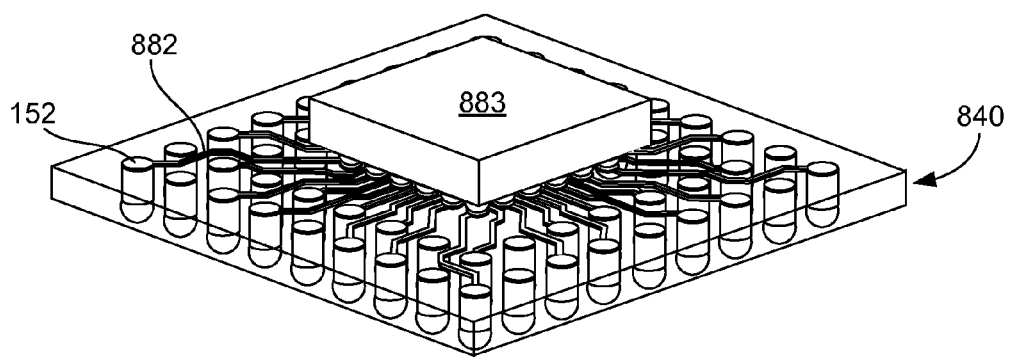
Figure 8E:
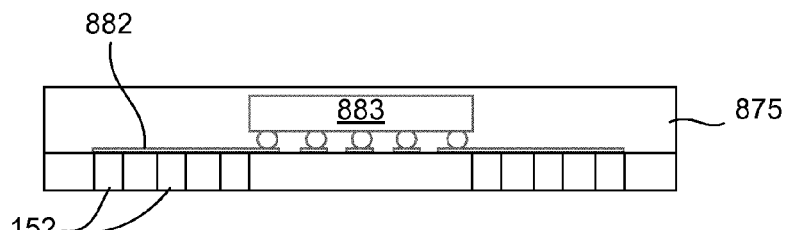
Figure 8F:
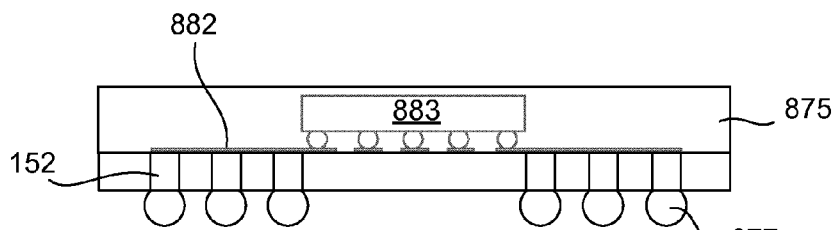

After the redistribution layer is formed, a multiplicity of dice 883 may be flip chip mounted to the carrier with solder bumps (or other appropriate I/O bumps) being arranged to electrically couple the bond pads on the dice with associated contact landings 881 on the carrier panel 840. FIG. 8(c). After the dice have been mounted on the carrier, the dice are encapsulated 875 (FIG. 8(e)), and the panel is thereafter bumped 877 and singulated to form packaged devices as illustrated in FIG. 8(f).

Although only a few embodiments of the invention have been described in detail, it should be appreciated that the invention may be implemented in many other forms without departing from the spirit or scope of the invention. FIGS. 7 and 8 have illustrated a couple of specific uses of the described chip carriers. However, it should be appreciated that the described chip carriers can be used in a wide variety of other packaging applications as well. In some described embodiments, a redistribution layer is formed over the top surface of the panel. It should be appreciated that if desired, multiple redistribution layers may be used and/or the redistribution layers may also be provided on the back surface of the carriers. The various illustrated packages were all single chip packages. However, it should be apparent that the described approach may also be used to form carriers for a wide variety of multi-chip packages, mixed device packages, and other device packages, as for example, packages that house passive devices, optical devices, electromechanical devices (MEMs), etc.

The wiring bundles and the resultant wiring blocks may be formed in a wide variety of geometries which facilitates the production of many different types of chip carriers. Since the layout of the wires in the wiring bundles dictates the via pattern on the resulting carriers, a wide variety of carrier geometries can be produced using the same wiring fixture with relatively inexpensive changes that necessitate only the development of the appropriate alignment plate layouts or other equivalent alignment mechanisms.

Although some specific wire tensioning and wire bundle encapsulation devices have been described, it should be apparent that a wide variety of other devices may be used to accomplish the same tasks. Therefore, the present embodiments should be considered illustrative and not restrictive and the invention is not to be limited to the details given herein, but may be modified within the scope and equivalents of the appended claims.

What is claimed is:

1. A method of forming chip carriers comprising:
providing a wire and rod support fixture having spaced apart first and second wire and rod alignment plates, each wire and rod alignment plate having a set of openings, the set of openings arranged in a pattern to define a a plurality of spaced apart two dimensional arrays of device areas;
positioning a multiplicity of wires and rods in the fixture such that the wires and rods extend substantially in parallel between the first and second wire and rod alignment plates, each wire being received in an associated opening in each of the first and second wire and rod alignment plates and each rod being received in a corresponding opening in each of the first and second wire and rod alignment plates;
encapsulating the wires and rods with an encapsulant material to form an encapsulant block that encases the substantially parallel wires and rods; and
slicing the encapsulant block into a multiplicity of chip carrier panels, wherein each chip carrier panel has a plurality of device areas, wherein each device area has a multiplicity of conductive wire vias and rod vias extending therethrough that are formed from sections of the multiplicity of wires and rods.

2. The method as recited in claim 1 wherein only a plurality of conductive wires are positioned in the wire and rod alignment plates such that the wires extend substantially in parallel, wherein the encapsulant block also encases the conductive wires.

3. The method as recited in claim 1 wherein the wire and rod alignment plates are arranged to keep the wires and rods in tension during the encapsulation.

4. The method as recited in claim 1 wherein the chip carrier panels sliced from the encapsulant block each have a form selected from the group consisting of:
   a) a panel having a two dimensional array of device areas defined thereon;
   b) a strip having a plurality of spaced apart two dimensional arrays of device areas defined thereon; and
   c) a wafer having a two dimensional array of device areas defined thereon; and
   wherein each device area has a multiplicity of vias provided therein, each device area being intended for use as a chip carrier for a separate integrated circuit package after singulation of the chip carrier panel.

5. The method as recited in claim 4;
mounting a multiplicity of dice on a first surface of the chip carrier panel, wherein each die is mounted on an associated device area;
electrically connecting each die to a plurality of the conductive wire vias in the associated device area; and
molded a plastic encapsulant material over the first surface of the chip carrier panel encase the dice; and
singulating the chip carrier panel to form a multiplicity of packaged integrated circuit devices, each singulated device corresponding to an associated device area in the chip carrier panel.

6. The method as recited in claim 1 further comprising forming contact pads and conductive redistribution traces on a first surface of the chip carrier panel, wherein at least some of the traces extend between an associated contact pad and an associated wire via to electrically connect the associated contact pad to the associated wire via.

7. The method as recited in claim 1 wherein each chip carrier panel has a multiplicity of device areas defined therein, each device area having a multiplicity of wire vias formed therein, the method further comprising singulating the chip carrier panel to provide a multiplicity of singulated chip carrier devices, each singulated chip carrier device corresponding to an associated device area in the chip carrier panel.

8. The method of packaging an integrated circuit comprising:
forming a chip carrier panel as recited in claim 1;
mounting a die on a die attach region on a first surface of the chip carrier panel;
electrically connecting the die to a plurality of the conductive wire vias; and
encasing the die and a portion of the first surface of the chip carrier.

9. The method of packaging an integrated circuit as recited in claim 6 further comprising forming a multiplicity of solder bumps on a second surface of the chip carrier panel, wherein each solder bump is formed over and is in electrical communication with an associated one of the multiplicity of wire vias.

10. The method as recited in claim 9 wherein:
the die is electrically connected to the conductive wire vias by at least one selected from the group consisting of (a) bonding wires and (b) solder joints connected to associated contact pads on the first surface of the chip carrier, wherein conductive traces patterned on the first surface of the chip carrier electrically connect selected contact pads to associated conductive wire vias; and
a molded encapsulant material formed over the first surface of the chip carrier is used to encase the die.

11. The method as recited in claim 1 wherein the wires and rods are arranged to extend substantially vertically during the encapsulation of the wires.

* * * * *